United States Patent
Shim

(10) Patent No.: US 9,508,456 B1
(45) Date of Patent: Nov. 29, 2016

(54) SELF REPAIR DEVICE AND METHOD THEREOF

(71) Applicant: SK hynix Inc., Icheon-si Gyeonggi-do (KR)

(72) Inventor: Young Bo Shim, Dangjin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/878,081

(22) Filed: Oct. 8, 2015

(30) Foreign Application Priority Data

Jun. 16, 2015 (KR) .................. 10-2015-0085296

(51) Int. Cl.
| | | |
|---|---|---|
| G11C 17/00 | (2006.01) | |
| G11C 29/00 | (2006.01) | |
| G11C 17/16 | (2006.01) | |
| G11C 17/18 | (2006.01) | |

(52) U.S. Cl.
CPC ............. G11C 29/78 (2013.01); G11C 17/16 (2013.01); G11C 17/18 (2013.01); G11C 29/76 (2013.01)

(58) Field of Classification Search
CPC ....... G11C 29/78; G11C 29/76; G11C 29/04; G11C 17/16; G11C 17/18
See application file for complete search history.

(56) References Cited

U.S. PATENT DOCUMENTS

| | | | | |
|---|---|---|---|---|
| 6,324,104 B1* | 11/2001 | Matsui | ............... | G06F 12/0893 |
| | | | | 365/200 |
| 6,657,907 B2 | 12/2003 | Lee | | |
| 9,190,175 B2* | 11/2015 | Shim | .................... | G11C 29/787 |
| 9,362,004 B2* | 6/2016 | Shim | .................. | G11C 29/1201 |
| 2007/0076497 A1* | 4/2007 | Chae | ...................... | G11C 29/84 |
| | | | | 365/207 |
| 2010/0254205 A1* | 10/2010 | Yamauchi | ............. | G11C 17/16 |
| | | | | 365/200 |
| 2013/0322149 A1* | 12/2013 | Ryu | ..................... | G11C 7/1045 |
| | | | | 365/96 |
| 2014/0146624 A1 | 5/2014 | Son et al. | | |

\* cited by examiner

*Primary Examiner* — Toan Le
(74) *Attorney, Agent, or Firm* — William Park & Associates Ltd.

(57) ABSTRACT

A self repair device may include: an electrical fuse array configured to store bit information of a failed address in a fuse; an electrical fuse controller configured to store a row address or column address corresponding to a failed bit when a failure occurs, generate a repair address by comparing a failed address inputted during a test to the address stored therein, output a rupture enable signal for controlling a rupture operation of the electrical fuse array, and output row fuse set data or column fuse set data in response to the failed address; and a row/column redundancy unit configured to perform a row redundancy or column redundancy operation in response to the row fuse set data or the column fuse set data applied from the electrical fuse array.

20 Claims, 6 Drawing Sheets

SELF REPAIR DEVICE AND METHOD THEREOF

CROSS-REFERENCES TO RELATED APPLICATION

The present application claims priority under 35 U.S.C. §119(a) to Korean application number 10-2015-0085296 filed on Jun. 16, 2015, in the Korean Intellectual Property Office, which is incorporated herein by reference in its entirety.

BACKGROUND

1. Technical Field

Various embodiments generally relate to an integrated circuit, and more particularly to a self repair device and method for improving repair efficiency during a package repair operation.

2. Related Art

A semiconductor memory such as Dynamic Random Access Memory (hereinafter referred to as "DRAM") includes a plurality of memory cells arranged in a matrix. Demands for highly integrated semiconductor memory devices are leading to a decrease in the design rule, which defines the minimum feature size of chip lithography. The decrease in the design rule may increase the probability of defects in the semiconductor memory devices, and one or more defects in a chip may cause the chip to be discarded.

The proportion of devices on the wafer found to perform properly is referred to as "yield." With an increase of defective cells, the yield may decrease. Thus, research is being conducted on methods for efficiently repairing defective cells in order to improve the yield.

Examples of the method for repairing a defective cell may include a technology using a repair circuit which replaces a defective cell with a redundancy cell. In general, the repair circuit includes a redundancy column/row arranged in columns and rows each including a plurality of redundancy memory cells. The repair circuit selects a redundancy column/row in place of a column/row in which a defect occurred.

That is, when a row and/or column address found to be defective is inputted, a redundancy column/row is selected in place of such a defective column/row of a normal memory cell bank.

A semiconductor memory device may include a plurality of fuses to store information as to the address to which the defective cell is assigned. For example, the semiconductor memory device may store the address of the defective cell in the plurality of fuses by selectively cutting them.

Examples of the method for repairing a defective cell in DRAM may include a method for repairing a defective cell at a wafer level and a method for repairing a defective cell at a package level.

The method for repairing a defective cell at the wafer level is to replace a defective cell with a redundancy cell after performing a test at the wafer level. The method for repairing a defective cell at the package level is to replace a defective cell with a redundancy cell at the package level after performing a test at the package level.

In a known self repair mode at the package level, only the redundancy row is used to perform a repair operation, and the redundancy column is not used. Thus, when a column-based defect occurs, the yield may decrease because the column-based defect cannot be repaired.

During a package-level test, a bit failure, a row failure, or a column failure may occur. A semiconductor package having such failure requires a repair circuit, which leads to an increase in the size of each semiconductor chip. Thus, the repair circuit may cause a decrease in the net die per wafer.

If a semiconductor memory device has only a repair circuit for a row self repair mode used in the semiconductor package, such a self repair can be performed only in the row redundancy. Thus, a bit failure and a row failure can be repaired, but a column failure cannot be repaired.

Furthermore, in order to increase the yield, test process must be repeated several times. When such a situation is repeated, the yield ramp-up time may be increased.

SUMMARY

Various embodiments are directed to a self repair device and method which is capable of selectively applying a row self repair mode and a column self repair mode during a package function test and performing a redundancy operation, thereby improving repair efficiency.

In an embodiment, a self repair device may include: an electrical fuse array configured to store information of a failed address in a fuse; an electrical fuse controller configured to store a row address or column address corresponding to a failed bit when a failure occurs, generate a repair address by comparing a failed address inputted during a test to the address stored therein, output a rupture enable signal for controlling a rupture operation of the electrical fuse array and output row fuse set data or column fuse set data in response to the failed address; and a row/column redundancy unit configured to perform a row redundancy or column redundancy operation in response to the row fuse set data or the column fuse set data applied from the electrical fuse array.

In an embodiment, a self repair method may include: selecting a row self repair mode or column self repair mode in response to a fuse set select signal; storing a row address or column address corresponding to a first failed bit in a latch; generating a repair address by comparing a failed address, which has been inputted during a test to the address stored in the latch; searching unused fuse set information in response to fuse information applied from an electrical fuse array during a boot-up operation; receiving the repair address and the fuse set information, and rupturing the electrical fuse array; and performing a row redundancy operation or column redundancy operation in response to output data of the electrical fuse array.

According to the embodiments, the self repair device and method may select the row or column redundancy according to various types of defects which occur in the package, and optimize the repair operation, thereby contributing to improving the package yield and reducing the yield ramp-up time.

DETAILED DESCRIPTION

Hereinafter, a self repair device and method will be described below with reference to the accompanying drawings through various examples of embodiments.

Figure 1:
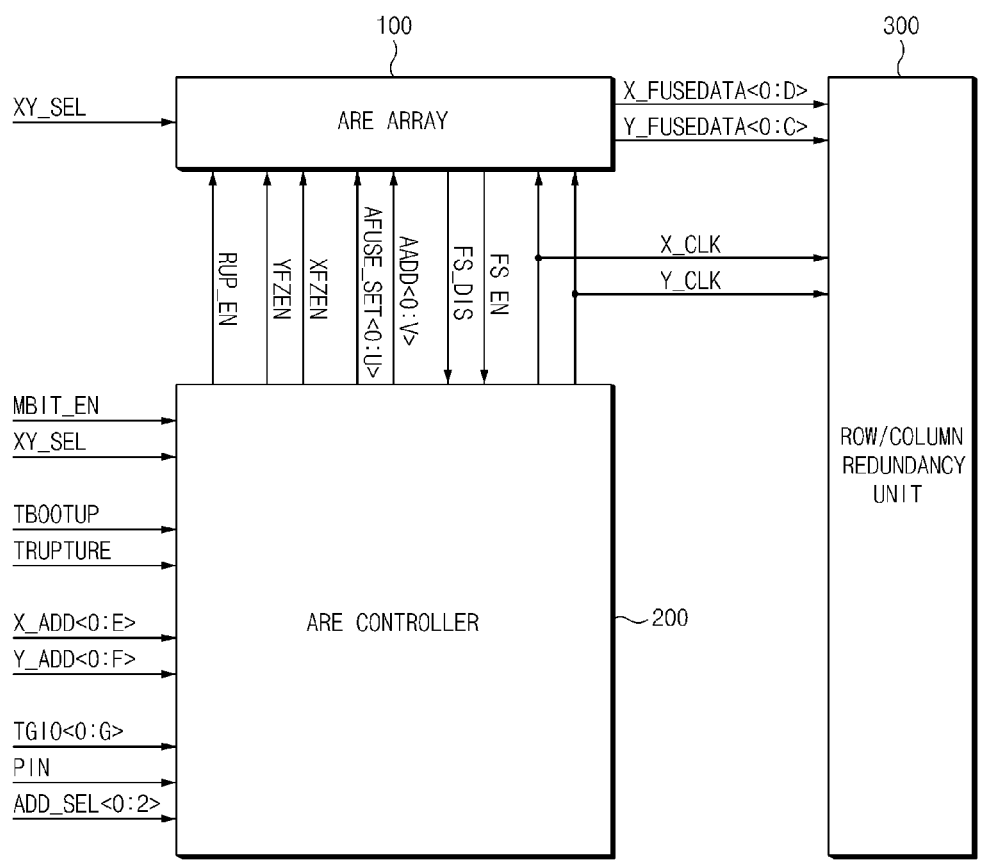
FIG. 1 is a configuration diagram of a self repair device in accordance with an embodiment.

FIG. 1 is a configuration diagram of a self repair device in accordance with an embodiment. In an embodiment, a semiconductor memory device may include the self repair device.

The self repair device in accordance with an embodiment may include an Array Rupture Electrical fuse (hereinafter referred to as "ARE") array 100, an ARE controller 200, and a row/column redundancy unit 300.

The ARE array 100 may store information on the address that a failure has occurred. Such information collected during a memory test may be temporarily stored in a storage device of memory tester, and then applied the semiconductor memory device to rupture electrical fuses corresponding to the respective address in order to permanently store the information at the semiconductor memory device.

The ARE array 100 may receive a fuse set select signal XY_SEL, a rupture enable signal RUP_EN, a row fuse set enable signal XFZEN, a column fuse set enable signal YFZEN, a unused fuse signal AFUSE_SET<0:U>, a repair address AADD<0:V>, and clocks X_CLK and Y_CLK. The ARE array 100 may output a fuse set enable signal FS_EN and a fuse set disable signal FS_DIS to the ARE controller 200, and output row fuse set data X_FUSEDATA<0:D> and column fuse set data Y_FUSESATA<0:C> to the row/column redundancy unit 300.

As the sizes of elements forming a semiconductor integrated circuit device decrease and the number of elements included in one semiconductor chip increase, the level of defect density also increases. The increase of the defect density may cause the yield of the semiconductor device to decrease.

In order to lower the defect density, a redundancy circuit for replacing a defective cell with a redundancy cell may be used. In an embodiment, a semiconductor memory device may have the redundancy circuit (e.g. fuse circuit) at each of a row (e.g., word line) and a column (e.g., bit line).

The redundancy circuit may include the ARE array 100 to store information as to the address found to be defective (hereinafter referred to as "failed address"). The ARE array 100 may include a plurality of fuse sets each having a plurality of fuse lines. The ARE array 100 may be a memory for storing information on failed addresses. The ARE array 100 may select a corresponding row line according to an address representing fuse select information.

Each of the fuse sets may program information by melting fuse using an over-current. Furthermore, at the package level of the semiconductor memory device, the fuse set may perform a self repair (e.g., repair or rupture) in order to repair a bit fail.

When a test of the memory is ended, the ARE array 100 may apply the information to the semiconductor memory device, and rupture electrical fuses corresponding to the respective bits in order to permanently store the information at the semiconductor memory device. The ARE array 100 may control the rupture operation in response to the rupture enable signal RUP_EN applied from the ARE controller 200.

The ARE array 100 may store the failed address information through a rupture operation when the rupture enable signal RUP_EN is activated. Each of the fuse sets may include E-fuses, and may program information by melting a fuse using an over-current.

The ARE controller 200 may receive data on the failed address from a memory tester, and output the received data to the ARE array 100 to control the rupture of an E-fuse. Before a memory operation is performed after a power-up operation, the ARE controller 200 may output row/column fuse data stored in the ARE array 100 to the row/column redundancy unit 300.

The ARE controller 200 may receive a multi-bit enable signal MBIT_EN, a fuse set select signal XY_SEL, a boot-up signal TBOOTUP, a rupture signal TRUPTURE, a row address X_ADD<0:E>, a column address Y_ADD<0:F>, global line data TGIO<0:G>, an input control signal PIN, an address select signal ADD_SEL<0:2>, the fuse set enable signal FS_EN, and the fuse set disable signal FS_DIS. The ARE controller 200 may output the rupture enable signal RUP_EN, the row fuse set enable signal XFZEN, the column fuse set enable signal YFZEN, the unused fuse signal AFUSE_SET<0:U>, the repair address AADD<0:V>, and the clocks X_CLK and Y_CLK.

The row/column redundancy unit 300 may store fuse data (e.g. information as to which fuses are cut) of failed addresses from the ARE array 100 before a memory operation. The row/column redundancy unit 300 may compare an address inputted during the memory operation to the stored data, and enable a normal row/column or spare row/column.

The row/column redundancy unit 300 may receive the row fuse set data X_FUSEDATA<0:D>, the column fuse set data Y_FUSESATA<0:C>, and the clocks X_CLK and Y_CLK, and control a redundancy operation.

The row fuse set data X_FUSEDATA<0:D> may include fuse set data for outputting fuse set information stored in an ARE row cell array to the row redundancy unit 300 during a boot-up operation of the ARE array 100. The column fuse set data Y_FUSEDATA<0:C> may include fuse set data for outputting fuse set information stored in an ARE column cell array to the column redundancy unit 300 during a boot-up operation of the ARE array 100.

Figure 2:
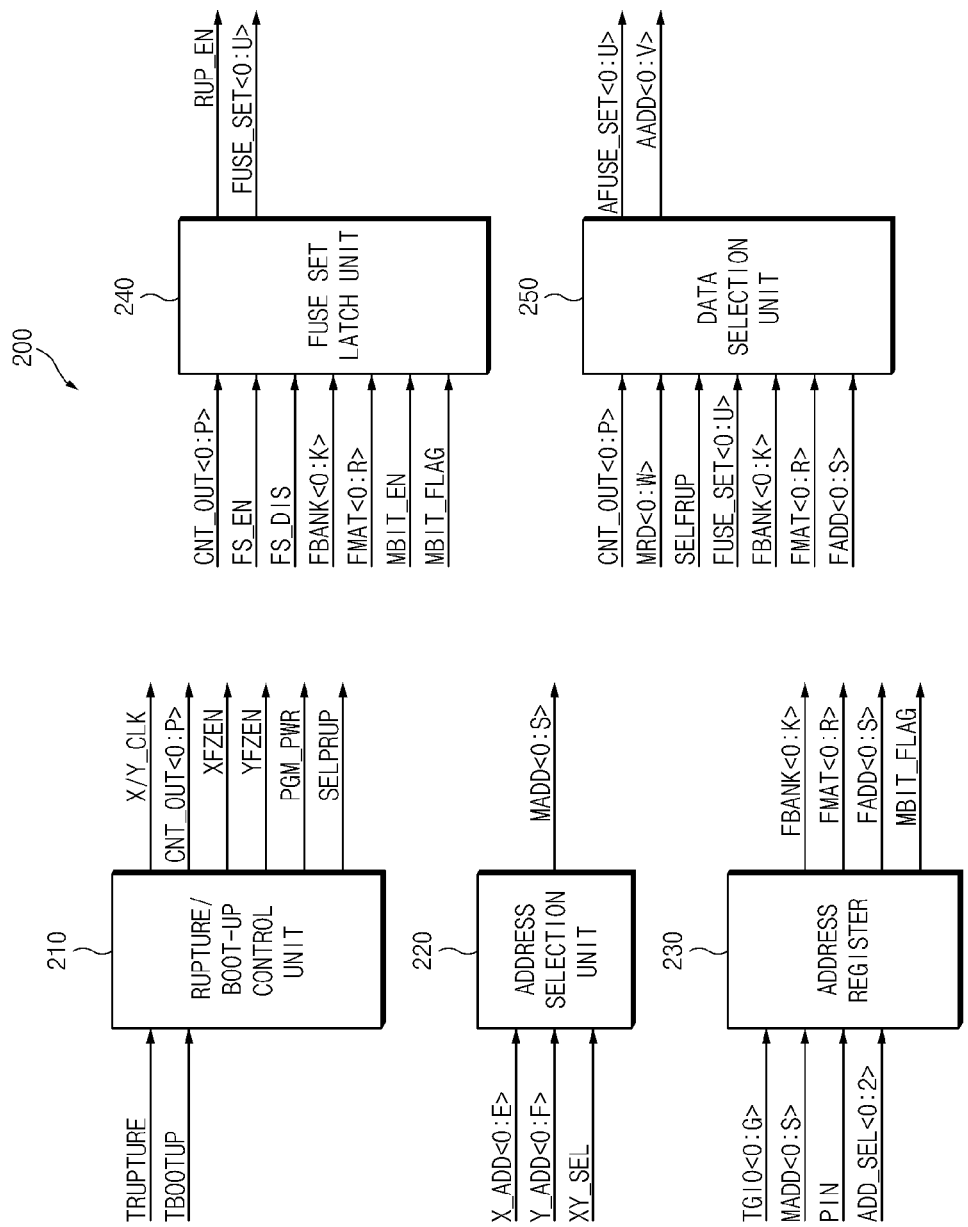
FIG. 2 is a detailed circuit diagram of an ARE controller of FIG. 1.

FIG. 2 is a detailed circuit diagram of the ARE controller 200 of FIG. 1.

The ARE controller 200 may include a rupture/boot-up control unit 210, an address selection unit 220, an address register 230, a fuse set latch unit 240, and a data selection unit 250.

The rupture/boot-up control unit 210 may control a rupture operation for an E-fuse included in the ARE array 100 based on a failed address inputted from an external memory tester. The rupture/boot-up control unit 210 may output fuse data on the failed address stored in the E-fuse to the row/column redundancy unit 300 after power-up, but before a memory operation.

The rupture/boot-up control unit 210 may receive the boot-up signal TBOOTUP and the rupture signal TUPTURE, and output the clocks X_CLK and Y_CLK, a count signal CNT_OUT<0:P>, the row fuse set enable signal XFZEN, the column fuse set enable signal YFZEN, a power signal PGM_PWR, and a self rupture signal SELFRUP.

The boot-up signal TBOOTUP may include a signal for controlling an operation of transmitting E-fuse information stored in the ARE array 100 to the row/column redundancy unit 300 before the memory operation. The rupture signal TRUPTURE may include a signal for controlling, based on a failed address, a rupture operation for an E-fuse included in the ARE array 100.

The rupture/boot-up control unit 210 may include an oscillator and/or a counter (not shown). The oscillator and counter may generate the clocks X_CLK and Y_CLK to provide the clocks X_CLK and Y_CLK to the ARE array 100 and the row/column redundancy unit 300. The oscillator and counter may also generate the count signal CNT_OUT<0:P> to provide the count signal CNT_OUT<0:P> to the fuse set latch unit 240 and the data selection unit 250. The count signal CNT_OUT<0:P> may include a signal which is aligned with a fuse set address of the ARE array 100 when an unused fuse set of the failed address region is searched for.

The row fuse set enable signal XFZEN may include a signal for enabling a row fuse set information region during the boot-up operation of the ARE array 100. The column fuse set enable signal YFZEN may include a signal for enabling a column fuse set information region during the boot-up operation of the ARE array 100. The self rupture signal SELFRUP may be enabled during a self repair operation. The self rupture signal SELFRUP may be used to select an unused fuse set signal FUSE_SET<0:U>, a bank signal FBANK<0:K>, a mat signal FMAT<0:R>, and a select address FADD<0:S>, which correspond to self repair information, instead of memory repair data MRD<0:W>.

The address selection unit 220 may select a row address and a column address which are inputted from outside, and output the selected addresses to the address register 230. The address selection unit 220 may receive the row address X_ADD<0:E>, the column address Y_ADD<0:F>, and the fuse set select signal XY_SEL, and output a select signal MADD<0:S>.

A row self repair mode or a column self repair mode may be selected in response to the fuse set select signal XY_SEL inputted before the boot-up operation of the ARE array 100 or before a memory test. The row address X_ADD<0:E> may include a row address which is inputted with a memory active command. The column address Y_ADD<0:F> may include a column address which is inputted with a memory write/read command. The select signal MADD<0:S> may correspond to a signal which is selected between the row address X_ADD<0:E> and the column address Y_ADD<0:F> by the fuse set select signal XY_SEL.

The address register 230 may extract fuse information (e.g., bank or fuse region) from the failed address applied from the address selection unit 220, and output the extracted information to the fuse set latch unit 240 and the data selection unit 250. When a failure occurs during a memory test for a self repair operation, the address register 230 may store bank information, mat information, and row/column address found to be defective (e.g., information on the failed cell).

The address register 230 may receive the global line data TGIO<0:G>, the select signal MADD<0:S>, the input control signal PIN, and the address select signal ADD_SEL<0:2>, and output the bank signal FBANK<0:R>, the mat signal FMAT<0:R>, the select address FADD<0:S>, and the multi-bit flag signal MBIT_FLAG.

The global line TGIO<0:G> may include a global data line which operates in a specific test mode. When a memory cell accessed during a memory read operation is a memory cell which has passed the test, the global line TGIO<0:G> may be enabled to a high level and transmit, to a data output buffer of the memory, the information that the memory cell has passed the test. On the other hand, when the memory cell is a failed memory cell, the global line TGIO<0:G> may transition to a low level and transmit, to the data output buffer of the memory, the information that the memory cell has failed the test.

The input control signal PIN may include a pulse signal for controlling a pipe register input unit to store data loaded in the global line TGIO<0:G> to a pipe register, while the information as to whether the memory cell has passed or failed the test is transmitted to the data output buffer during the memory read operation. The input control signal PIN and the output of the global line TGIO<0:G> may be combined to store the failed address in the address register 230.

The address select signal ADD_SEL<0:2> may be used to select failed addresses stored in first to third latches of the address register 230 one by one, and output the bank signal FBANK<0:K>, the mat signal FMAT<0:R>, the select address FADD<0:S>, and the multi-bit flag signal MBIT_FLAG.

The bank signal FBANK<0:K> may include bank information selected by the address select signal ADD_SEL<0:2> among a plurality of failed addresses stored in the address register 230. The mat signal FMAT<0:R> may include mat information selected by the address select signal ADD_SEL<0:2> among the plurality of failed addresses stored in the address register 230. The select address FADD<0:S> may include address information selected by the address select signal ADD_SEL<0:2> among the plurality of failed addresses stored in the address register 230.

The multi-bit flag signal MBIT_FLAG may indicate whether a failed address selected by the address select signal ADD_SEL<0:2> among the plurality of failed addresses stored in the address register 230 is a multi-bit failure (e.g., row failure or column failure).

The fuse set latch unit 240 may, during the boot-up operation of the ARE array 100, search the fuse region where the failed address is positioned in the ARE array 100 and store unused fuse set information. The fuse set latch unit 240 may receive the count signal CNT_OUT<0:P>, the fuse set enable signal FS_EN, the fuse set disable signal FS_DIS, the bank signal FBANK<0:K>, the mat signal FMAT<0:R>, the multi-bit enable signal MBIT_EN, and the multi-bit flag signal MBIT_FLAG. The fuse set latch unit 240 may output the rupture enable signal RUP_EN and the unused fuse signal AFUSE_SET<0:U>.

The fuse set enable signal FS_EN may include a bit signal for enabling a cell array selected by the fuse select signal XY_SEL among the row cell arrays or column cell arrays of the ARE array 100. That is, the fuse set enable signal FS_EN may indicate whether the corresponding fuse set is used. The fuse set disable signal FS_DIS may include a bit signal for disabling a cell array selected by the fuse select signal XY_SEL among the row cell arrays or column cell arrays of the ARE array 100. That is, the fuse set disable signal FS_DIS may indicate whether the corresponding fuse set is a failed fuse set.

The multi-bit enable signal MBIT_EN may include a signal for controlling the repair function only when a selected failed address is a multi-bit address. The multi-bit enable signal MBIT_EN and the multi-bit flag signal MBIT_FLAG may be combined to control the rupture enable signal RUP_EN. For example, when the multi-bit enable signal MBIT_EN has a logic high level, the rupture enable signal RUP_EN may be enabled only in a case where the failed address is a multi-bit address. On the other hand, when the multi-bit enable signal has a logic low level, the rupture enable signal RUP_EN may be enabled for all failed addresses, regardless of whether each of the failed addresses is a multi-bit address or single-bit address.

The rupture enable signal RUP_EN may be obtained by combining the multi-bit enable signal MBIT_EN and the multi-bit flag signal MBIT_FLAG, and indicate whether a rupture operation for the corresponding failed address can be performed. For example, when the rupture enable signal RUP_EN has a logic high level, repair operations may be performed. Thus, when the self repair sequence is performed, the corresponding fuse may be ruptured. On the other hand, when the rupture enable signal RUP_EN has a logic low level, repair operations may not be performed. Thus, even if the self repair sequence is performed, the corresponding fuse may not be ruptured.

The data selection unit 250 may select one between the memory repair data MRD<0:W> and the bank signal FBANK<0:K>, the mat signal FMAT<0:R>, or the select address FADD<0:S>, which is applied from the address register 230 in order to perform row or column self repair, according to the self rupture signal SELFRUP, and output the repair address AADD<0:V> to the ARE array 100. The data selection unit 250 may select the unused fuse set signal FUSE_SET<0:U> inputted from the fuse set latch unit 240, and output the unused fuse signal AFUSE_SET<0:U> to the ARE array 100. Furthermore, the data selection unit 250 may receive the count signal CNT_OUT<0:P> applied from the rupture/boot-up control unit 210.

The memory repair data MRD<0:W> may include repair information such as fuse set information, failed bank information, failed mat information, and failed address information, which are inputted from the memory tester in order to carry out a repair operation after a test operation such as a wafer test. The unused fuse set signal FUSE_SET<0:U> may indicate unused fuse set information which is searched in the failed address region during the boot-up operation.

The unused fuse signal AFUFSE_SET<0:U> may include unused fuse set information which is outputted to the ARE array 100 in order to perform a repair operation. The repair address AADD<0:V> may include address information which is outputted to the ARE array 100 in order to perform a repair operation.

Figure 3:
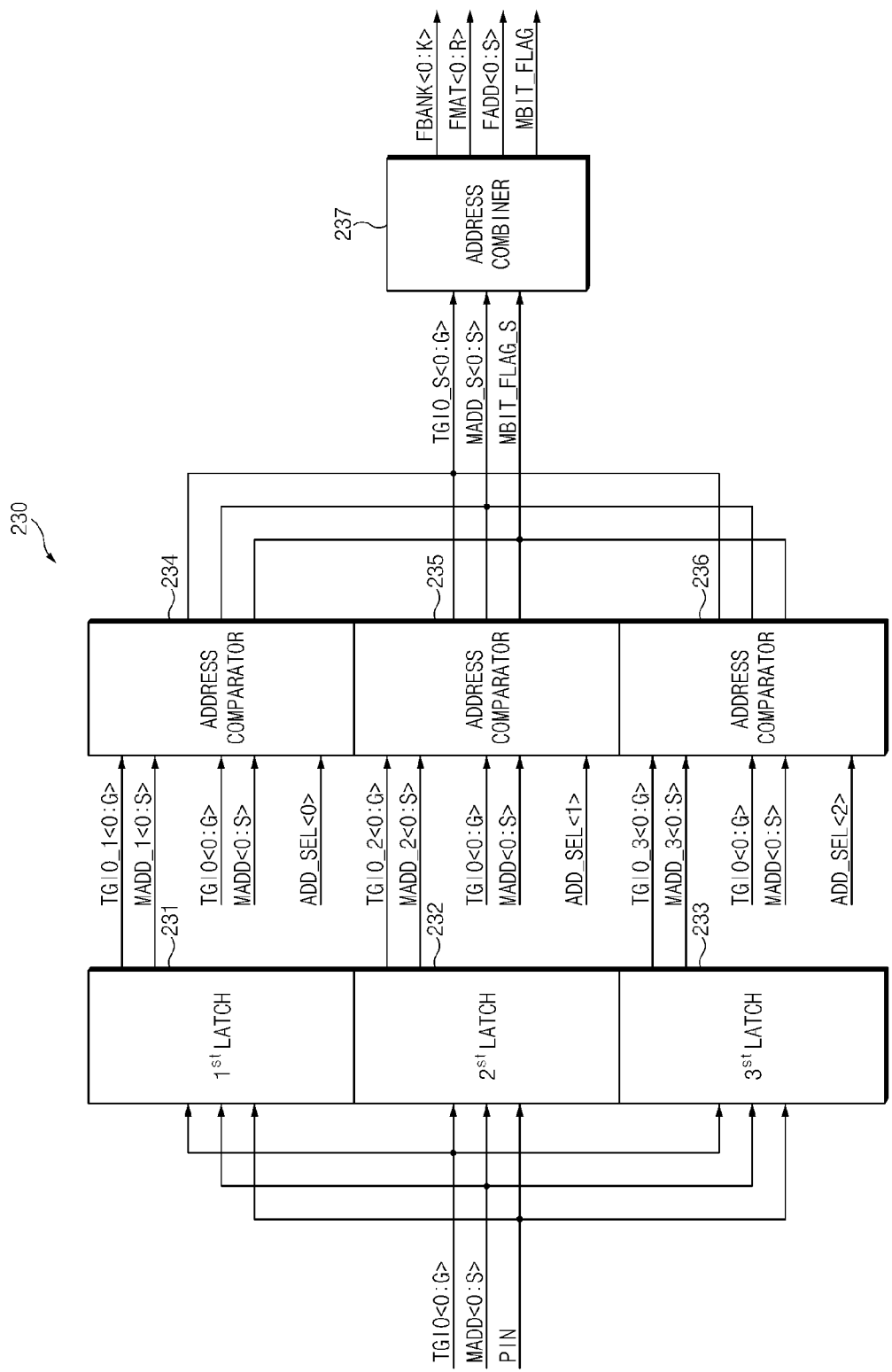
FIG. 3 is a detailed circuit diagram of an address register of FIG. 2.

FIG. 3 is a detailed circuit diagram of the address register 230 of FIG. 2.

The address register 230 may include a plurality of latches 231 to 233, a plurality of address comparators 234 to 236, and an address combiner 237.

The plurality of latches 231 to 233 may store the global line data TGIO<0:G>, the select signal MADD<0:S>, and the input control signal PIN. The latch 231 may output the global line data TGIO_1<0:G> and the select signal MADD_1<0:S>. The latch 232 may output global line data TGIO_2<0:G> and the select signal MADD_2<0:S>. The latch 233 may output the global line data TGIO_3<0:G> and the select signal MADD_3<0:S>.

The address comparator 234 may compare the global line data TGIO_1<0:G> and the select signal MADD_1<0:S>, which are outputted from the latch 231, to the global line data TGIO<0:G> and the select signal MADD<0:S> according to the address select signal ADD_SEL<0>. The address comparator 235 may compare the global line data TGIO_2<0:G> and the select signal MADD_2<0:S>, which are outputted from the latch 232, to the global line data TGIO<0:G> and the select signal MADD<0:S> according to the address select signal ADD_SEL<1>. The address comparator 236 may compare the global line data TGIO_3<0:G> and the select signal MADD_3<0:S>, which are outputted from the latch 233, to the global line data TGIO<0:G> and the select signal MADD<0:S> according to the address select signal ADD_SEL<2>.

The plurality of address comparators 234 to 236 may compare the signal of the global line TGIO<0:G> and the select signal MADD<0:S>, which are applied from the address selection unit 220, to the signals stored in the latches 231 to 233, and output the global line data TGIO S<0:G>, the select signal MADD S<0:S>, and the multi-bit flag signal MBIT_FLAG_S.

The address combiner 237 may combine the global line data TGIO S<0:G>, the select signal MADD S<0:S>, and the multi-bit flag signal MBIT_FLAG_S, and output the bank signal FBANK<0:K>, the mat signal FMAT<0:R>, the select address FADD<0:S>, and the multi-bit flag signal MBIT_FLAG.

Figure 4:
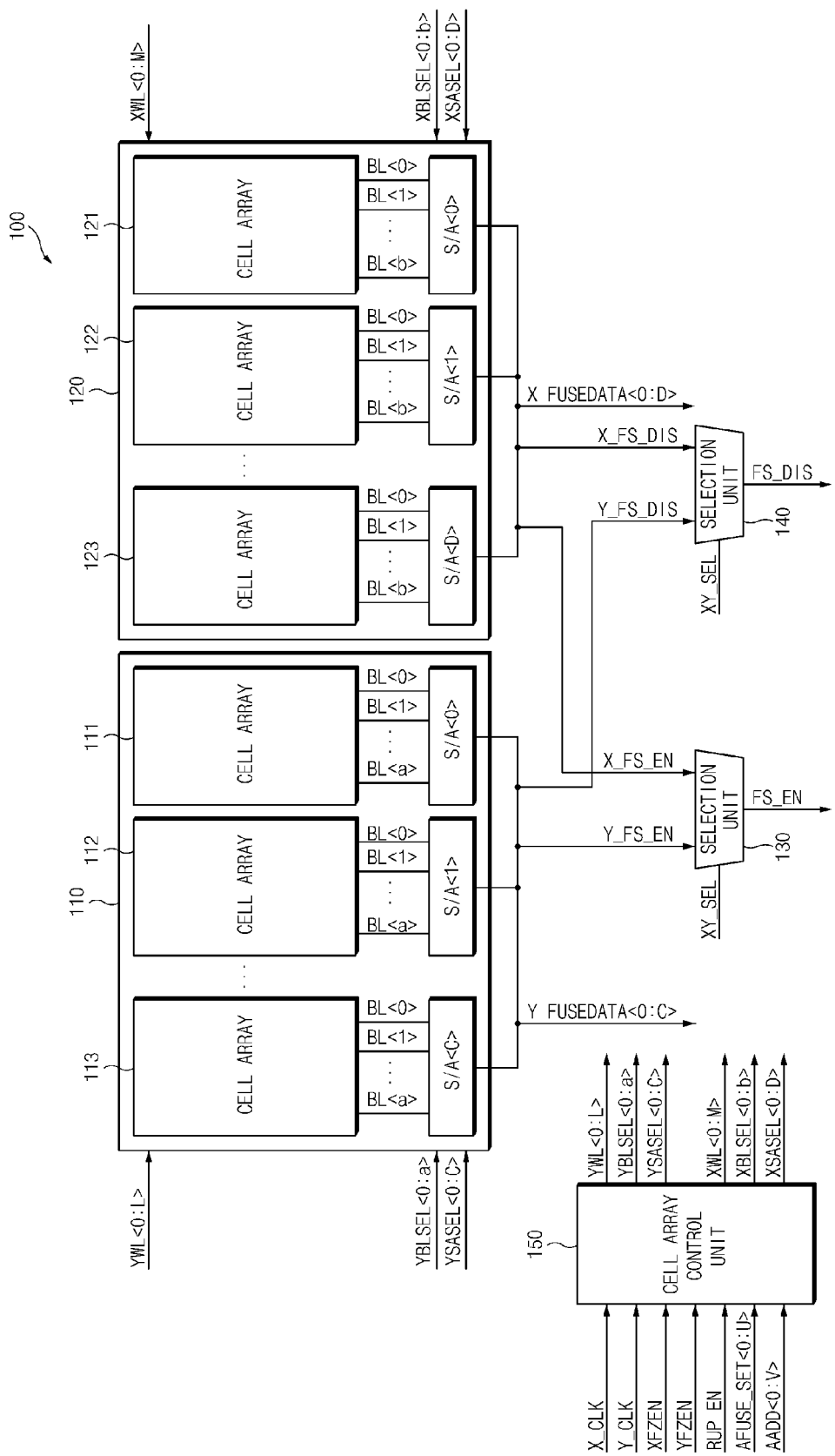
FIG. 4 is a detailed circuit diagram of the ARE array of FIG. 1.

FIG. 4 is a detailed circuit diagram of the ARE array 100 of FIG. 1.

The ARE array 100 may include a column cell array 110, a row cell array 120, selection units 130 and 140, and a cell array control unit 150.

The column cell array 110 may include a plurality of cell arrays 111 to 113 and a plurality of sense amplifiers S/A<0: C>. The plurality of cell arrays 111 to 113 and the plurality of sense amplifiers S/A<0:C> may be coupled to each other through bit lines BL<0:a>. A cell array may be selected between the plurality of cell arrays 111 to 113 according to a word line signal YWL<0:L>. The plurality of sense amplifiers S/A<0:C> may receive a bit line sense select signal YBLSEL<0:a> and a sense amplifier select signal YSASEL<0:C>, and output column fuse set data Y_FUSESATA<0:C>, a fuse set enable signal Y_FS_EN, and a fuse set disable signal Y_FS_DIS.

The row cell array 120 may include a plurality of cell arrays 121 to 123 and a plurality of sense amplifiers S/A<0: D>. The plurality of cell arrays 121 to 123 and the plurality of sense amplifiers S/A<0:D> may be coupled to each other through bit lines BL<0:b>. A cell array may be selected between the plurality of cell arrays 121 to 123 according to a word line signal XWL<0:L>. The plurality of sense amplifiers S/A<0:D> may receive a bit line sense select signal XBLSEL<0:b> and a sense amplifier select signal XSASEL<0:D>, and output row fuse set data X_FUSESATA<0:D>, a fuse set enable signal X_FS_EN, and a fuse set disable signal X_FS_DIS.

The selection unit 130 may select one of the fuse set enable signal X_FS_EN and the fuse set enable signal Y_FS_EN in response to the fuse set select signal XY_SEL, and output the selected signal as the fuse set enable signal FS_EN. Furthermore, the selection unit 140 may select one of the fuse set disable signal X_FS_DIS and the fuse set disable signal Y_FS_DIS in response to the fuse set select signal XY_SEL, and output the selected signal as the fuse set disable signal FS_DIS.

The cell array control unit 150 may receive the clocks X_CLK and Y_CLK, the row fuse set enable signal XFZEN, the column fuse set enable signal YFZEN, the rupture enable signal RUP_EN, the unused fuse signal AFUSE_SET<0:U>, and the repair address AADD<0:V>, output the word line signal YWL<0:L>, the bit line select signal YBLSEL<0:a>, and the sense amplifier select signal YSASEL<0:C>, and output the word line signal XWL<0:M>, the bit line select signal XBLSEL<0:b>, and the sense amplifier select signal XSASEL<0:D>.

Figure 5:
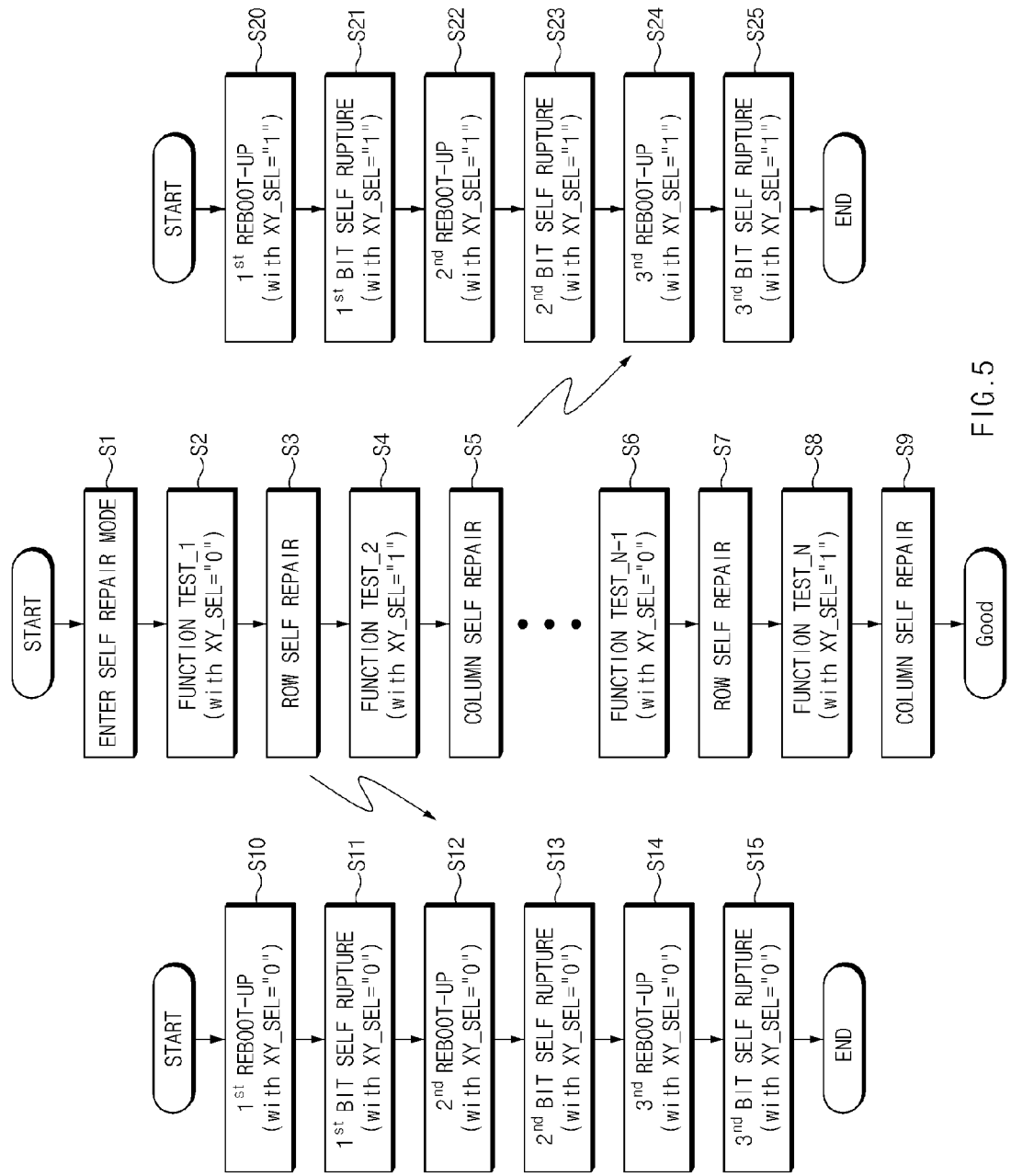
FIG. 5 is a flowchart for describing the operation of the self repair device in accordance with an embodiment.

FIG. 5 is a flowchart for describing the operation of the self repair device in accordance with an embodiment.

During semiconductor device fabrication, a wafer test is performed on all dies of a wafer to repair all failed cells at the wafer level. Then, good dies are assembled in a package, and a package test is performed. At this time, due to refresh weak or lack of sensing margin, margin-related failures may occur. In order to repair such failed cells, the memory may perform a repair operation by itself. This operation may be referred to as "self repair".

When entering a self repair mode at step S1, a self repair device may be switched to the row self repair mode in a case where the fuse set select signal XY_SEL has a logic low level, and switched to the column self repair mode in a case where the fuse set select signal XY_SEL has a logic high level.

That is, when the fuse set select signal XY_SEL has a logic low level during a first function test, the self repair device may enter the row self repair mode at step S2, and perform a row self repair operation at step S3. Then, when the fuse set select signal XY_SEL has a logic high level during a second function test, the self repair device may enter the column self repair mode at step S4, and perform a column self repair operation at step S5.

Then, when the fuse set select signal XY_SEL has logic low level during an (N−1)th function test, the self repair device may reenter the row self repair mode at step S6, and perform a row self repair operation at step S7. Then, when the fuse set select signal XY_SEL has a logic high level during an Nth function test, the self repair device may reenter the column self repair mode at step S8, and perform a column self repair operation at step S9.

Hereafter, the operation of the row self repair mode will be described as follows.

Since the address register 230 includes three latches 231 to 233, the address register 230 may store address information on three failures during a memory test. In an embodiment, the case in which the address register 230 includes three latches 231 to 233 was taken as an example for description. However, the number of latches is not limited thereto.

When a bank is activated after the semiconductor memory device enters a specific test mode, an external bank address may be ignored, but rather all banks may be activated. Furthermore, when the fuse set select signal XY_SEL is inputted at a low level, the address selection unit 220 may select the row address X_ADD<0:E> and output the selected address as the select signal MADD<0:S>.

Then, data may be written to all cells of the memory, and a read operation may be performed. When a failure occurs in an unspecified cell during the read operation, the data of the global line TGIO<0:G> may transition from a high level to a low level.

At this time, the row address information of the failed cell and the bank information loaded in the global line TGIO may be stored in the first latch 231 of the address register 230 by the input control signal PIN.

During a subsequent read operation of the semiconductor memory device, second and third failures may occur at different row addresses. Then, the row address information of the failed cells and the bank information loaded in the global line TGIO may be stored in the second latch 232 and the third latch 233 of the address register 230 by the global line TGIO and the input control signal PIN.

Then, when a failure occurs during a read operation of the semiconductor memory device, the address comparator 234 may compare an address applied from the global line TGIO to the address latched in the latches 231 to 233. When the addresses are identical to each other, the address comparator 234 may increase the corresponding multi-bit flag signal MBIT_FLAG_S to indicate whether the failure is a single-bit failure or multi-bit failure.

Here, the bit number of the multi-bit failure may be defined as a larger number than the number of repair units. For example, when two word lines are replaced during a repair operation, the multi-bit failure may indicate three bits or more.

Then, when the memory test is ended, the multi-bit flag signal MBIT_FLAG may indicate whether each of three failed addresses stored in the latches of the address register 230 are a single-bit address or a multi-bit address. For example, when the multi-bit flag signal MBIT_FLAG has a logic low level, it may indicate that the failed address is a single-bit address, and when the multi-bit flag signal MBIT_FLAG has a logic high level, it may indicate that the failed address is a multi-bit address.

So far, the process of capturing a failed row address to perform row self repair has been described. Next, a process of repairing the failed row addresses stored in the first latch 231, the second latch 232, and the third latch 233 while sequentially selecting the failed row addresses will be described as follows.

When the address select signal ADD_SEL<0:2> is enabled to select the failed address stored in the first latch 231 in order to repair the first failed address, the bank signal FBANK<0:K>, the mat signal FMAT<0:R>, the select address FADD<0:S>, and the multi-bit flag signal BMIT_FLAG may be outputted to the fuse set latch unit 240.

Then, when the boot-up signal TBOOTUP is enabled, the rupture/boot-up control unit 210 may output the clocks X_CLK and Y_CLK. According to the clocks X_CLK and Y_CLK, the counter may be operated to output the count signal CNT_OUT<0:P> to the data selection unit 250. The data selection unit 250 may output the repair address AADD<0:V> to the ARE array 100, and the ARE array 100 may scan the fuse sets according to the repair address AADD<0:V>.

That is, when the address select signal ADD_SEL<0> is enabled, the ARE array 100 may scan the fuse set region based on the bank signal, the mat signal, and the select address inputted to the fuse set latch unit 240. The fuse set latch unit 240 may search the fuse set enable signal FS_EN and the fuse set disable signal FS_DIS, and store unused fuse set information.

So far, the process of preparing failed addresses required for repairing defective addresses and unused fuse sets of the failed address region has been described. Next, a repair process will be described.

When the rupture signal TRUPTURE is inputted to repair the corresponding failures, the rupture/boot-up control unit 210 may enable the power signal PGM_PWR to generate a voltage required for fuse rupturing. The data selection unit 250 may output the unused fuse signal AFUSE_SET<0:U> to the ARE array 100 through the unused fuse set signal FUSE_SET<0:U> according to the self rupture signal SEL-FRUP inputted from the rupture/boot-up control unit 210. Then, the data selection unit 250 may combine the bank signal FBANK<0:K>, the mat signal FMAT<0:R>, and the select address FADD<0:S> related to the failed address, and output the repair address AADD<0:V> to the ARE array 100.

Then, when a rupture operation is performed while bits corresponding to the failed address in a selected unused fuse set are sequentially increased, the repair operation for the selected failed address may be completed.

So far, the process of repairing the failed row address in the first latch 231 has been described. Next, a process of repairing failed row addresses stored in the second and third latches 232 and 233 will be described.

In order to repair the second failed address, the address select signal ADD_SEL<0> may be disabled, and the address select signal ADD_SEL<1> may be enabled. Then, the bank signal FBANK<0:K>, the mat signal FMAT<0:R>, the select address FADD<0:S>, and the multi-bit flag signal MBIT_FLAG for the failed address stored in the second latch 232 may be outputted to the fuse set latch unit 240. Then, an operation of searching an unused fuse set and repairing the second failed address may be performed in the same manner as described in the above repair process.

In order to repair the third failed address, the address select signal ADD_SEL<1> may be disabled, and the address select signal ADD_SEL<2> may be enabled. Then, the bank signal FBANK<0:K>, the mat signal FMAT<0:R>, the select address FADD<0:S>, and the multi-bit flag signal MBIT_FLAG for the failed address stored in the third latch 233 may be outputted to the fuse set latch unit 240. Then, an operation of searching an unused fuse set and repairing the third failed address may be performed in the same manner as described in the above repair process.

In the row self repair mode, the fuse set select signal XY_SEL may become a low level. When a first reboot-up operation is performed at step S10, a self rupture operation for the first bit may be performed at step S11. Then, when a second reboot-up operation is performed at step S12, a self rupture operation for the second bit may be performed at step S13. Then, when a third reboot-up operation is performed at step S14, a self rupture operation for the third bit may be performed at step S15.

So far, the row self repair process for three failures has been described. Next, a process of switching to the column self repair mode and capturing and repairing a failed address will be described.

When a bank is activated after the memory enters a specific test mode, an external bank address may be ignored. Simultaneously, all banks may be activated. Then, when the fuse set select signal XY_SEL is inputted at a high level, the address selection unit 220 may select the column address Y_ADD<0:F> and output the selected address as the select signal MADD<0:S>.

Data may be written to all cells of the semiconductor memory device, and then a read operation may be performed. When a failure occurs in an unspecified cell during the read operation, the data of the global line TGIO<0:G> may transition from a high level to a low level.

At this time, the column address information of the failed cell and the bank information loaded in the global line TGIO may be stored in the first latch 231 of the address register 230 by the input control signal PIN.

During a subsequent read operation of the semiconductor memory device, second and third failures may occur at different column addresses. Then, the column address information of the failed cells and the bank information loaded in the global line TGIO may be stored in the second latch 232 and the third latch 233 of the address register 230 by the global line TGIO and the input control signal PIN.

Then, when a failure occurs during a read operation of the semiconductor memory device, the address comparator 234 may compare an address applied from the global line TGIO to the address latched in the latches 231 to 233. When the addresses are the same as each other, the address comparator 234 may increase the corresponding multi-bit flag signal MBIT_FLAG_S to indicate whether the failure is a single-bit failure or multi-bit failure.

At this time, the bit number of the multi-bit failure may be defined as a larger number than the number of repair units. For example, when one word line is replaced during a repair operation, the multi-bit failure may indicate two bits or more.

Then, when the memory test is ended, the multi-bit flag signal MBIT_FLAG may indicate whether each of three failed addresses stored in the latches of the address register 230 is a single-bit address or multi-bit address. For example, when the multi-bit flag signal MBIT_FLAG has a logic low level, it may indicate that the failed address is a single-bit address, and when the multi-bit flag signal MBIT_FLAG has a logic high level, it may indicate that the failed address is a multi-bit address.

So far, the process of capturing a failed column address to perform column self repair has been described. Next, a process of repairing failed column addresses stored in the first latch 231, the second latch 232, and the third latch 233 while sequentially selecting the failed column addresses will be described as follows.

When the address select signal ADD_SEL<0:2> is enabled to select the failed address stored in the first latch 231 in order to repair the first failed address, the bank signal FBANK<0:K>, the mat signal FMAT<0:R>, the select address FADD<0:S>, and the multi-bit flag signal BMIT_FLAG may be outputted to the fuse set latch unit 240.

Then, when the boot-up signal TBOOTUP is enabled, the rupture/boot-up control unit 210 may output the clocks X_CLK and Y_CLK. According to the clocks X_CLK and Y_CLK, the counter may be operated to output the count signal CNT_OUT<0:P> to the data selection unit 250. The data selection unit 250 may output the repair address AADD<0:V> to the ARE array 100, and the ARE array 100 may scan the fuse sets according to the repair address AADD<0:V>.

That is, when the address select signal ADD_SEL<0> is enabled, the ARE array 100 may scan the fuse set region based on the bank signal, the mat signal, and the select address inputted to the fuse set latch unit 240. The fuse set latch unit 240 may search the fuse set enable signal FS_EN and the fuse set disable signal FS_DIS, and store unused fuse set information.

So far, the process of preparing failed addresses required for repairing defective addresses and unused fuse sets of the failed address region has been described. Next, a repair process will be described.

When the rupture signal TRUPTURE is inputted to repair the corresponding failure, the rupture/boot-up control unit 210 may enable the power signal PGM_PWR to generate a voltage required for fuse rupturing. The data selection unit 250 may output the unused fuse signal AFUSE_SET<0:U> to the ARE array 100 through the unused fuse set signal FUSE_SET<0:U> according to the self rupture signal SELFRUP inputted from the rupture/boot-up control unit 210. Then, the data selection unit 250 may combine the bank signal FBANK<0:K>, the mat signal FMAT<0:R>, and the select address FADD<0:S> related to the failed address, and output the repair address AADD<0:V> to the ARE array 100.

Then, when the rupture operation is performed while bits corresponding to the failed address in a selected unused fuse set are sequentially increased, a repair operation for the selected failed address may be completed.

So far, the process of repairing the failed column address stored in the first latch 231 has been described. Next, a process of repairing the failed column addresses stored in the second and third latches 232 and 233 will be described as follows.

In order to repair the second failed address, the address select signal ADD_SEL<0> may be disabled, and the address select signal ADD_SEL<1> may be enabled. Then, the bank signal FBANK<0:K>, the mat signal FMAT<0:R>, the select address FADD<0:S>, and the multi-bit flag signal MBIT_FLAG for the failed address stored in the second latch 232 may be outputted to the fuse set latch unit 240. Then, an operation of searching an unused fuse set and repairing the second failed address may be performed in the same manner as described in the above repair process.

In order to repair the third failed address, the address select signal ADD_SEL<1> may be disabled, and the address select signal ADD_SEL<2> may be enabled. Then, the bank signal FBANK<0:K>, the mat signal FMAT<0:R>, the select address FADD<0:S>, and the multi-bit flag signal MBIT_FLAG for the failed address stored in the third latch 233 may be outputted to the fuse set latch unit 240. Then, an operation of searching an unused fuse set and repairing the third failed address may be performed in the same manner as described in the above repair process.

In the column self repair mode, the fuse set select signal XY_SEL may become a high level. When a first reboot-up operation is performed at step S20, a self rupture operation for the first bit may be performed at step S21. Then, when a second reboot-up operation is performed at step S22, a self rupture operation for the second bit may be performed at step S23. Then, when a third reboot-up operation is performed at step S24, a self rupture operation for the third bit may be performed at step S25.

So far, the column self repair process for three failures has been described. Furthermore, the capture and repair processes for three failed row addresses and three failed column addresses have been described.

When failed cells exist even after the above process, the row or column self repair mode may be arbitrarily selected to repair failed addresses during a function test, until all of the failed cells are repaired.

As described above, when both of the row self repair mode and the column self repair mode are used together with the function test, a single-bit fail, a row-based fail, and a column failure can be repaired, which may improve the package yield.

Figure 6:
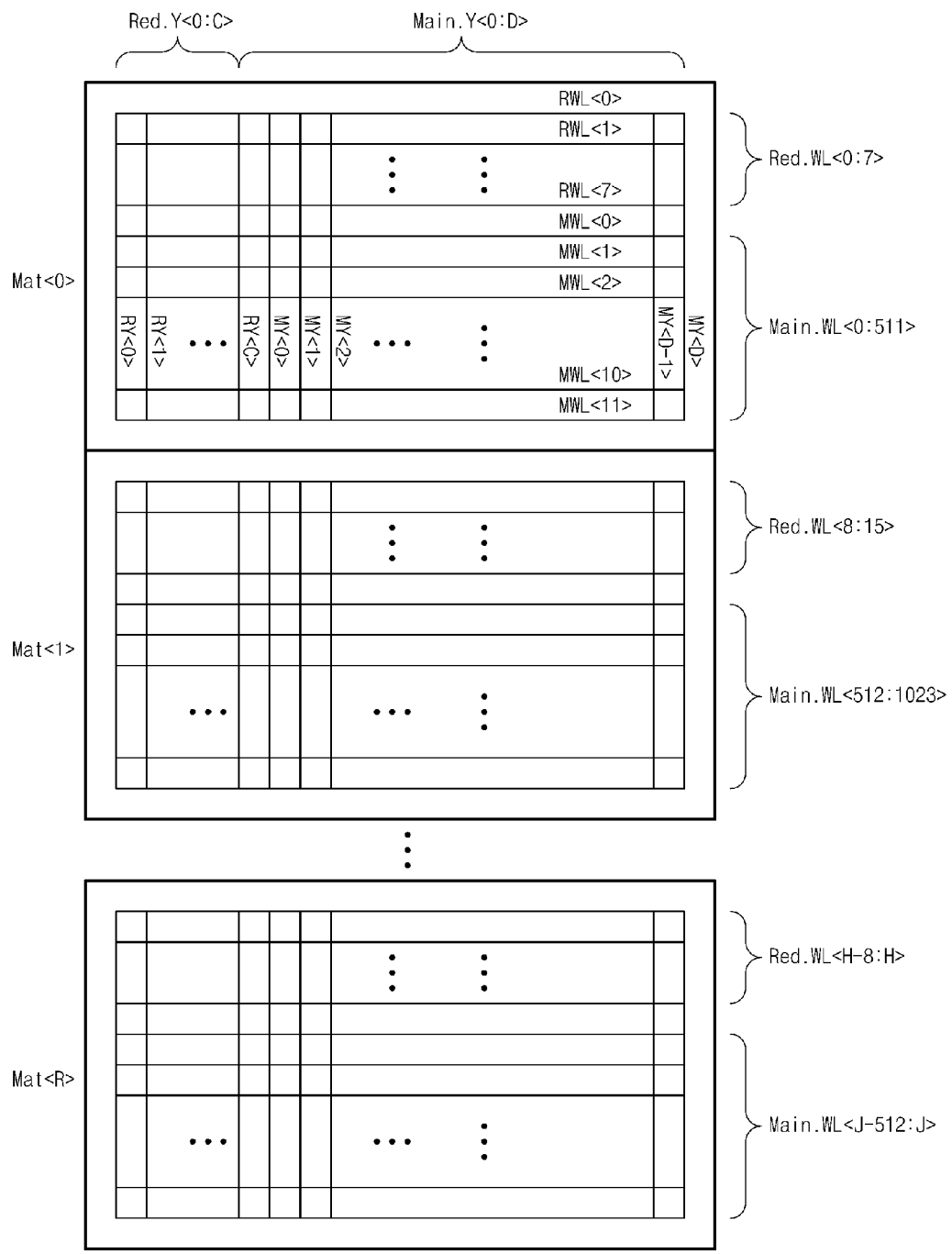
FIG. 6 is a diagram for describing a row/column redundancy failure repair algorithm in an embodiment.

FIG. 6 is a diagram for describing a row/column redundancy failure repair algorithm in the embodiment.

A plurality of mats Mat<0:R> may include redundancy column lines RedY<0:C>, main column lines MainY<0:D>, redundancy word lines RedWL<0:H>, and main word lines MainWL<0:J>. The mat Mat<0> may include the redundancy word lines RedWL<0:7> and the main word lines MainWL<0:511>, the mat Mat<1> may include the redundancy word lines RedWL<8:15> and the main word lines MainWL<512:1023>, and the mat Mat<R> may include the redundancy word lines RedWL<H-8:H> and the main word line MainWL<J-512:J>.

During the row repair mode, the main word lines MainWL<0:511> may be replaced with the redundancy word lines RedWL<0:7>. Furthermore, during the column repair mode, the main column lines MainY<0:D> may be replaced with the redundancy column lines RedY<0:C>.

Although the repair operation for three failures has been described, the number of failures that can be repaired is not limited thereto, and thus failures of more than three may also be repaired. In an embodiment, during the self repair mode, unused row or column fuse sets in the ARE array 100 may be used. In another embodiment, the semiconductor memory device may include additional row or column fuse sets dedicated to a package self repair operation. In an embodiment, at the semiconductor memory package level, the failed bank information, the failed row/column address information, and the fuse set information may be generated inside the semiconductor memory device. In another embodiment, at the semiconductor memory package level, the failed bank information, the failed row/column address information, and the fuse set information may be directly applied to the semiconductor memory device from outside to be used for repair. The rupture signal TRUPTURE, the boot-up signal TBOOTUP, the fuse set select signal XY_SEL, and the multi-bit enable signal MBIT_EN can be applied form outside or internally generated. In an embodiment, during the self repair mode, the self repair device may enter a specific test mode and load bank information to the global line TGIO. In another embodiment, the self repair device may use bank information inputted with an active command, rather than entering the specific test mode.

As such, the self repair device in accordance with an embodiment may automatically select the row or column redundancy according to various types of defects which occur in the package, and optimize the repair operation, thereby contributing to improving the package yield and reducing the yield ramp-up time.

While various embodiments have been described above, it will be understood to those skilled in the art that the embodiments described are by way of example only. Accordingly, the self repair device and method described herein should not be limited based on the described embodiments.

What is claimed is:

1. A self repair device comprising:
an electrical fuse array configured to store information of a failed address in a fuse;
an electrical fuse controller configured to store a row address or column address corresponding to a failed bit when a failure occurs, generate a repair address by comparing a failed address inputted during a test to the address stored therein, output a rupture enable signal for controlling a rupture operation of the electrical fuse array, and output row fuse set data or column fuse set data in response to the failed address; and
a row/column redundancy unit configured to perform a row redundancy or column redundancy operation in response to the row fuse set data or the column fuse set data applied from the electrical fuse array;
wherein the electrical fuse controller is configured to control the rupture operation when the failed address is a multi-bit address in response to a multi-bit enable signal.

2. The self repair device of claim 1, wherein the electrical fuse controller comprises:
a rupture/boot-up control unit configured to control a rupture and boot-up operation of the electrical fuse array in response to the failed address;
an address selection unit configured to select a row self repair mode or column self repair mode in response to a fuse set select signal;
an address register configured to extract fuse information from the failed address applied from the address selection unit, and store bank information, mat information, and row/column address information on row/column address found to be defective;
a fuse set latch unit configured to store unused fuse set information by searching a fuse region in which the failed address is positioned, during the boot-up operation of the electrical fuse array, and output an unused fuse signal and the rupture enable signal in response to an output of the rupture/boot-up control unit and an output of the address register; and a data selection unit configured to generate the repair address in response to the unused fuse signal, the output of the rupture/boot-up control unit, and the output of the address register.

3. The self repair device of claim 2, wherein the rupture/boot-up control unit receives a boot-up signal and a rupture signal, outputs a clock signal to the row/column redundancy unit, outputs a row fuse set enable signal and a column fuse set enable signal to the electrical fuse array, and outputs a count signal, a power signal, and a self rupture signal.

4. The self repair device of claim 2, wherein the address selection unit outputs the row address or column address as a select signal in response to a fuse set select signal.

5. The self repair device of claim 2, wherein the address register receives data of a global line, a select signal, an input control signal, and an address select signal, and outputs a bank signal, a mat signal, a select address, and a multi-bit flag signal.

6. The self repair device of claim 5, wherein the global line comprises a global data line, which operates in a specific test mode, is activated to a high level or transitions to a low level when a memory cell of a memory device, which has been accessed during a memory read operation, has passed or failed a test, and transmits, to a data output buffer of the memory device, the information as to whether the memory cell has passed or failed the test.

7. The self repair device of claim 5, wherein the input control signal comprises a pulse signal which controls a pipe register input unit to store the data, which has been loaded in the global line, in a pipe register, while the information as to whether the memory cell has passed or failed the test is transmitted to the data output buffer during the memory read operation.

8. The self repair device of claim 2, wherein the address register comprises:
    a plurality of latches configured to store a signal of the global line, a select signal, and an input control signal;
    a plurality of address comparators configured to compare outputs of the latches to the signal of the global line and the select signal in response to an address select signal; and
    an address combiner configured to combine outputs of the address comparators and output a bank signal, a mat signal, a select address, and a multi-bit flag signal.

9. The self repair device of claim 8, wherein the plurality of address comparators are sequentially selected one by one in response to the address select signal.

10. The self repair device of claim 8, wherein the multi-bit flag signal comprises a signal indicating whether a failed address selected by the address select signal among a plurality of failed addresses stored in the address register is a multi-bit failure.

11. The self repair device of claim 2, wherein the fuse set latch unit receives a fuse set enable signal and a fuse set disable signal which are applied from the electrical fuse array, a count signal applied from the rupture/boot-up control unit, a bank signal, a mat signal, and a multi-bit flag signal which are applied from the address register, and the multi-bit enable signal, and outputs the rupture enable signal and the unused fuse signal.

12. The self repair device of claim 11, wherein the fuse set enable signal comprises a bit signal for enabling a cell array selected by the fuse set select signal among row cell arrays or column cell arrays of the electrical fuse array, and indicates whether the corresponding fuse set is used.

13. The self repair device of claim 11, wherein the fuse set disable signal comprises a bit signal for disabling a cell array selected by the fuse set select signal among row cell arrays or column cell arrays of the electrical fuse array, and indicates whether the corresponding fuse set is a failed fuse set.

14. The self repair device of claim 11, wherein when the multi-bit enable signal has a logic high level, the fuse set latch unit enables the rupture enable signal only in a case where the failed address is a multi-bit address, and
    when the multi-bit enable signal has a logic low level, the fuse set latch unit enables the rupture enable signal for all failed addresses, regardless of whether the failed addresses are multi-bit addresses or single-bit addresses.

15. The self repair device of claim 2, wherein the data selection unit selects, according to a self rupture signal, one between memory repair data information and a bank signal, mat signal, or select address information applied from the address register, and outputs the repair address to the electrical fuse array.

16. The self repair device of claim 2, wherein the data selection unit selects an unused fuse set signal inputted from the fuse set latch unit, and outputs an unused fuse set signal found in the failed address region to the electrical fuse array during a boot-up operation.

17. The self repair device of claim 1, wherein the electrical fuse array comprises:
    a column cell array configured to be enabled by a column word line, output column fuse set data to the row/column redundancy unit, and output a column fuse set enable signal and a column fuse set disable signal;
    a row cell array configured to be enabled by a row word line, output row fuse set data to the row/column redundancy unit, and output a row fuse set enable signal and a row fuse set disable signal;
    a first selection unit configured to select one of the row fuse set enable signal and the column fuse set enable signal in response to a fuse set select signal, and output the selected signal as a fuse set enable signal;
    a second selection unit configured to select one of the row fuse set disable signal and the column fuse set disable signal in response to the fuse set select signal, and output the selected signal as a fuse set disable signal; and
    a cell array control unit configured to generate control signals for controlling the operations of the column cell array and the row cell array.

18. The self repair device of claim 17, wherein the cell array control unit receives a clock, the row fuse set enable signal, the column fuse set enable signal, the rupture enable signal, an unused fuse signal, and the repair address, outputs a signal of the column word line, a column bit line select signal, and a column sense amplifier select signal, and outputs a signal of the row word line, a row bit line select signal, and a row sense amplifier select signal.

19. A self repair method comprising:
    selecting a row self repair mode or column self repair mode in response to a fuse set select signal;
    storing a row address or column address corresponding to a first failed bit in a latch;
    generating a repair address by comparing a failed address, which has been inputted during a test, to the address stored in the latch;
    searching unused fuse set information in response to fuse information applied from an electrical fuse array during a boot-up operation;

receiving the repair address, a multi-bit enable signal and the fuse set information, and rupturing the electrical fuse array; and performing a row redundancy operation or column redundancy operation in response to output data of the electrical fuse array.

20. The self repair method of claim 19, further comprising repeating the above processes on failed bits inputted after the first failed bit.

* * * * *